(12) United States Patent
Davoodabadi

(10) Patent No.: US 8,638,252 B2
(45) Date of Patent: Jan. 28, 2014

(54) LOW POWER HIGH SPEED A/D CONVERTER

(75) Inventor: Mahdi Davoodabadi, Irvine, CA (US)

(73) Assignee: Tensorcom, Inc, Carlsbad, CA (US)

( * ) Notice: Subject to any disclaimer, the term of this patent is extended or adjusted under 35 U.S.C. 154(b) by 0 days.

(21) Appl. No.: 13/306,982

(22) Filed: Nov. 30, 2011

(65) Prior Publication Data

US 2013/0135128 A1    May 30, 2013

(51) Int. Cl.
  *H03M 1/16* (2006.01)
(52) U.S. Cl.
  USPC ............................................ 341/156; 341/155
(58) Field of Classification Search
  USPC .................................................. 341/155, 156
  See application file for complete search history.

(56) References Cited

U.S. PATENT DOCUMENTS

| | | | | |
|---|---|---|---|---|
| 5,581,255 A | * | 12/1996 | Hsu | 341/156 |
| 5,745,067 A | * | 4/1998 | Chou et al. | 341/156 |
| 6,107,949 A | * | 8/2000 | Gross, Jr. | 341/159 |
| 6,121,912 A | * | 9/2000 | Brandt | 341/156 |
| 6,127,959 A | * | 10/2000 | An | 341/156 |
| 6,222,475 B1 | * | 4/2001 | Okada | 341/156 |
| 6,388,602 B1 | * | 5/2002 | Yang | 341/159 |
| 6,590,518 B1 | * | 7/2003 | Taft | 341/156 |
| 6,891,493 B2 | * | 5/2005 | Whittaker et al. | 341/156 |
| 7,265,694 B2 | * | 9/2007 | Guidry | 341/120 |
| 2004/0155807 A1 | * | 8/2004 | van der Goes et al. | 341/156 |
| 2009/0195432 A1 | * | 8/2009 | Bailey | 341/156 |

* cited by examiner

*Primary Examiner* — Linh Nguyen
(74) *Attorney, Agent, or Firm* — Steven J Shattil (57) ABSTRACT

An analog-to-digital converter comprises a first set of comparators configured for generating a coarse digital measurement of an analog input signal, and a second set of comparators for performing a fine digital measurement of the analog input signal. The second set comprises a plurality of dynamic comparators, wherein each dynamic comparator is configurable for being activated by a clock signal. An activation circuit processes the coarse measurement and an input clock signal for generating a set of activation signals, which activate a subset of the dynamic comparators to generate the fine digital measurement.

18 Claims, 11 Drawing Sheets

LOW POWER HIGH SPEED A/D CONVERTER

FIELD

Certain aspects of the present disclosure relate to analog-to-digital converters (ADCs), and, more particularly, to Flash ADCs.

BACKGROUND

In one aspect of the related art, a process for converting an analog signal into a digital signal comprises measuring the amplitude of the analog signal at consistent time intervals and producing a set of signals representing the measured digital value. ADCs are well known in the art. One type of analog-to-digital converter uses a single comparator to successively compare an input signal to multiple reference signals. This type of ADC, while inexpensive, is inherently slow since the single comparator must make a number of successive comparisons in order to convert each analog sample into a digital output A Flash ADC (also known as parallel ADCs, or a direct-conversion ADC) provides a faster way to convert an analog signal to a digital signal. A Flash ADC uses a linear voltage ladder with a comparator at each "rung" of the ladder to compare the input voltage to successive reference voltages. Often these reference ladders are constructed from resistors. However alternative implementations may employ capacitive voltage division. The output of these comparators is typically coupled into a digital encoder which converts the inputs into a binary value.

The Flash ADC architecture is relatively simple. Aside from the comparators, it only requires logic for the final conversion to binary. However, a Flash ADC requires a large number of comparators compared to other ADCs, especially as the precision increases. A Flash ADC requires $2^n-1$ comparators for an n-bit conversion. While Flash ADCs are ideal for applications requiring very large bandwidth, due to their large number of comparators, they consume more power than other ADC architectures.

Therefore, there is a need in the art for an ADC architecture that provides the performance advantages of a Flash ADC while providing for lower power consumption.

SUMMARY

Aspects disclosed herein may provide the benefits and solve the problems described above. However, the disclosure is not intended to be limited to such systems, as aspects of the invention may provide additional advantages.

According to an aspect of the disclosure, a flash ADC comprises a coarse-measurement circuit, a fine-measurement circuit, and an activation circuit. The coarse-measurement circuit comprises a plurality of comparators configured for generating a coarse measurement of an analog input signal. The fine-measurement circuit comprises a plurality of subsets of dynamic comparators, wherein each dynamic comparator may be activated by a clock signal. Each subset of dynamic comparators can perform a fine digital measurement of the analog input signal. The activation circuit processes the coarse measurement along with an input clock signal for generating a set of activation signals. The activation signals comprise a set of clock signals and at least one set of constant-value signals. The dynamic comparators are not activated by the constant-value signals. Since only one subset of the fine-measurement dynamic comparators is activated to generate the fine digital measurement, the ADC consumes less power.

According to another aspect of the disclosure, an ADC method is provided. A coarse measurement of an analog input signal is performed, and a set of activation signals is generated from the coarse measurement and an input clock signal. The activation signals comprise a set of clock signals and at least one set of constant-value signals. The set of clock signals activate a corresponding subset of a plurality of dynamic comparators, which perform a fine measurement of the analog input signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure.

For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Although particular aspects are described herein, many variations and permutations of these aspects fall within the scope and spirit of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Figure 1:
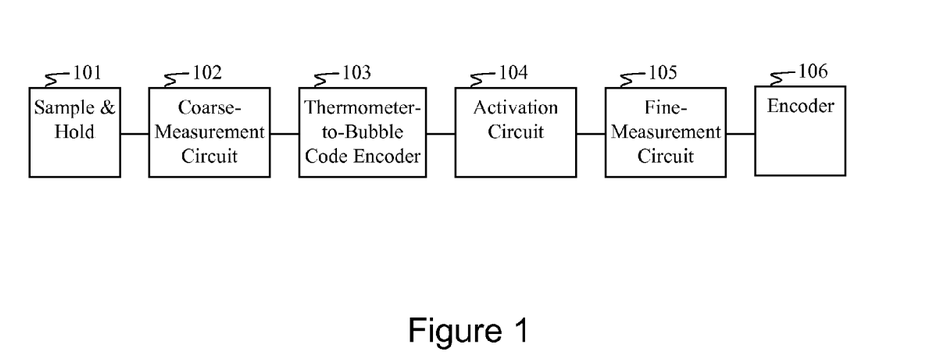
FIG. 1 is a block diagram of a Flash ADC in accordance with certain aspects of the present disclosure.

FIG. 1 is a block diagram of a Flash ADC configured in accordance with one aspect of the present invention. An analog input signal $V_{in}$ is generated for each predetermined sample interval (e.g., a symbol interval) by a sample-and-hold module 101, which samples an analog signal and generates an analog signal voltage, sometimes referred to as an analog input signal $V_{in}$. The analog input signal $V_{in}$ is first processed by a coarse-measurement circuit 102, which outputs a thermometer code indicative of a coarse measurement of $V_{in}$. A thermometer-to-bubble code encoder 103 converts the thermometer code to a bubble code, which controls the function of an activation circuit 104. The activation circuit 104 processes the bubble code and clock signals (e.g., a strobe signal) to produce an activation signal, which activates specified components of a fine-measurement circuit 105. The set of activated components (i.e., a subset of dynamic comparators) in the fine-measurement circuit 105 measures the analog input signal $V_{in}$ generated by the sample-and-hold module 101. An encoder 106 processes the bubble code from encoder 103 and at least one thermometer code output by the fine-measurement circuit 105 to produce a digital word comprising a set of binary data bits that is a digitized measurement of the signal $V_{in}$ in binary format.

Figure 2:
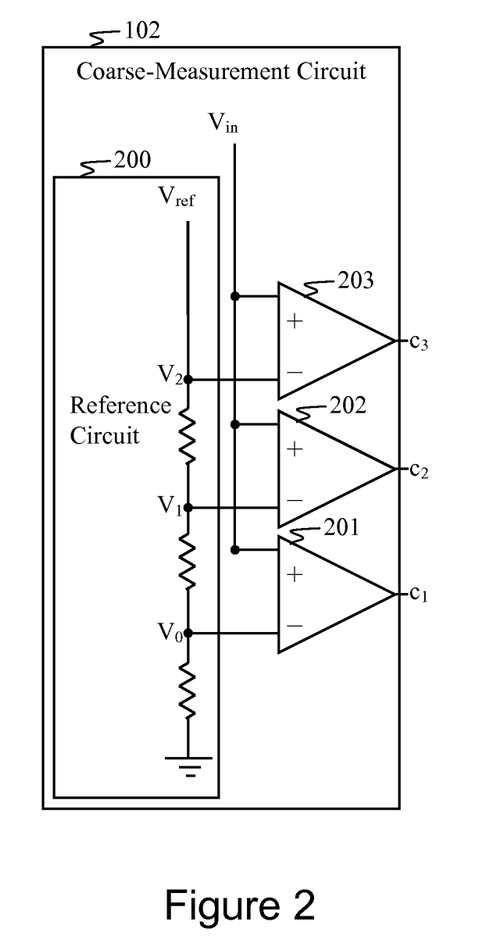
FIG. 2 is a block diagram of the coarse-measurement circuit in accordance with one aspect of the disclosure.

FIG. 2 is a block diagram of the coarse-measurement circuit 102 in accordance with one aspect of the invention. A first stage comprising a plurality of comparators 201-203 performs a coarse measurement of the analog input signal $V_{in}$. While three comparators 201-203 are depicted, in other aspects, the coarse-measurement circuit 102 may be implemented with alternative pluralities of comparators. A reference circuit, such as a voltage divider 200, is provided for generating a series of reference voltages (e.g., $V_0$, $V_1$, and $V_2$), each of which is coupled to a corresponding one of each comparator's 201-203 inputs. The reference circuit 200 may comprise any of various designs that are known in the art.

In the aspect depicted in FIG. 2, the resistive divider circuit 200 provides a different reference voltage $V_0$, $V_1$, and $V_2$ to each comparator 201, 202, and 203, respectively. As the analog input voltage $V_{in}$ exceeds the reference voltage at each comparator 201-203, the comparators' 201-203 outputs $c_1$-$c_3$ sequentially saturate to a high logic state. For example, the lowest comparator's 201 output bit $c_1$ transitions from its low state (e.g., 0) to its high state (e.g., 1) when $V_{in} \geq V_0$. Thus, the output $c=[c_1\ c_2\ c_3]=[0\ 0\ 0]$ indicates that $V_{in}$ is less than $V_0$, which denotes a first voltage range $\Delta V_0$. The output $c=[1\ 0\ 0]$ indicates that $V_{in}$ is within a second voltage range $\Delta V_1$ denoted by $V_0 \leq V_{in} < V_1$. The second comparator's 202 output bit $c_2$ transitions to its high state when $V_{in} \geq V_1$, so the output $c=[1\ 1\ 0]$ denotes a third voltage range $V_1 \leq V_{in} < V_2$. Comparator 203's output bit $c_3$ transitions to its high state when $V_{in} \geq V_2$. Thus, the output $c=[1\ 1\ 1]$ indicates that $V_{in}$ is in a fourth voltage range $\Delta V_3$ that is greater than or equal to $V_3$. The resulting output $c=[c_1\ c_2\ c_3]$ of the coarse-measurement circuit 102 is referred to as a thermometer code due to the progressive nature of how the output c changes as the input voltage $V_{in}$ rises.

With equal-valued resistors in the voltage divider 200, each successive output value $[c_1, c_2, c_3]$ represents the same amount of analog signal increase, providing a proportional response. For alternative applications, however, the resistor values in the voltage divider 200 may be non-equal to produce a nonlinear response to the analog input signal. In an alternative aspect, each resistor may have variable resistance values, such as to provide for a tunable circuit. In other aspects, the voltage divider 200 may comprise capacitive and/or inductive impedances.

In one aspect of the invention, a bit having a high-state value (i.e., 1) is prepended to the output c, converting the 3-bit word c into a 4-bit word. Thus, $c=[c_1\ c_2\ c_3]=[0\ 0\ 0]$ is converted to $c=[c_0\ c_1\ c_2\ c_3]=[1\ 0\ 0\ 0]$. Similarly, $c=[1\ 0\ 0]$ becomes $c=[1\ 1\ 0\ 0]$, $c=[1\ 1\ 0]$ becomes $c=[1\ 1\ 1\ 0]$, and $c=[1\ 1\ 1]$ becomes $c=[1\ 1\ 1\ 1]$.

Figure 3:
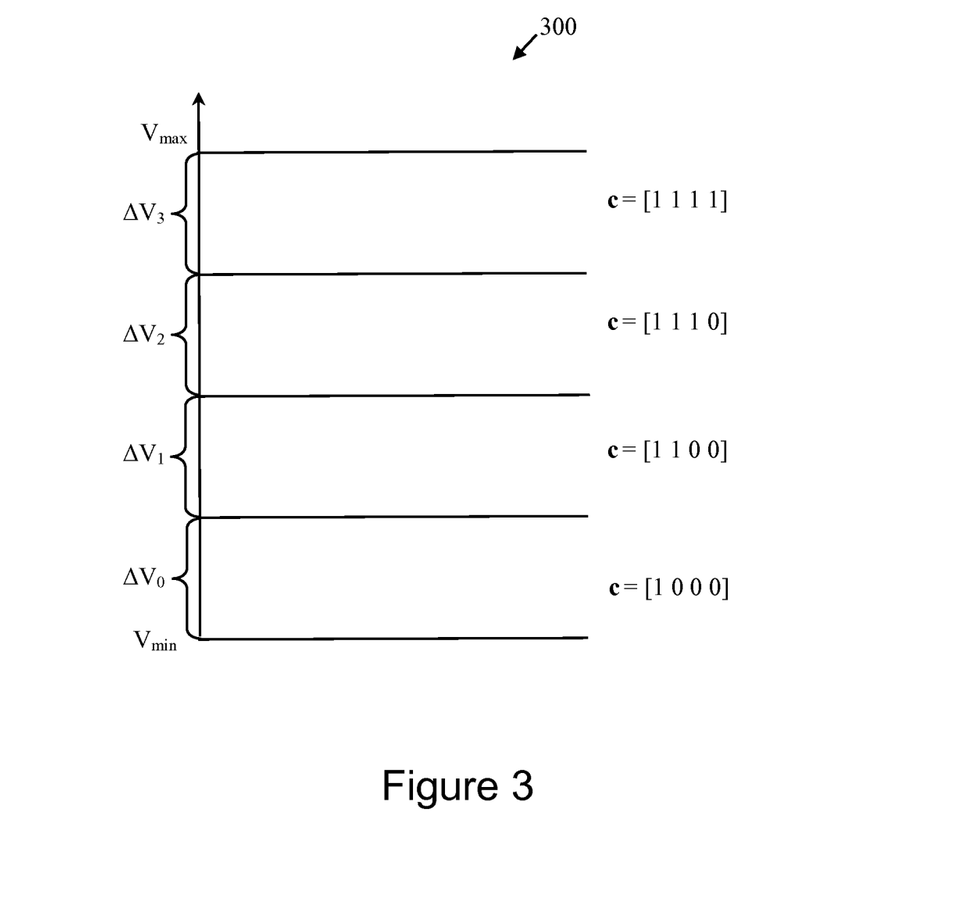
FIG. 3 is a plot of voltage ranges between a minimum reference voltage and a maximum reference voltage, and corresponding outputs of a coarse-measurement circuit configured in accordance with certain aspects of the present disclosure.

FIG. 3 is a plot 300 depicting a sequence of voltage ranges $\Delta V_0$-$\Delta V_3$ between a minimum reference voltage $V_{min}$ and a maximum reference voltage $V_{max}$, and the corresponding output c of the coarse-measurement circuit 102 when the analog input voltage $V_{in}$ occurs within each of the voltage ranges $\Delta V_0$-$\Delta V_3$. In one aspect of the invention, the voltage ranges $\Delta V_0$-$\Delta V_3$ are equal: $\Delta V_0 = \Delta V_1 = \Delta V_2 = \Delta V_3 = \Delta V$. Thus, the resolution of the coarse-measurement circuit 102 may be expressed by $\Delta V$. In aspects of the invention, the coarse-measurement circuit 102 may employ various voltage ranges. For example, a first voltage range may comprise a zero voltage or a non-zero voltage as its lower bound, $V_{min}$.

Figure 4:
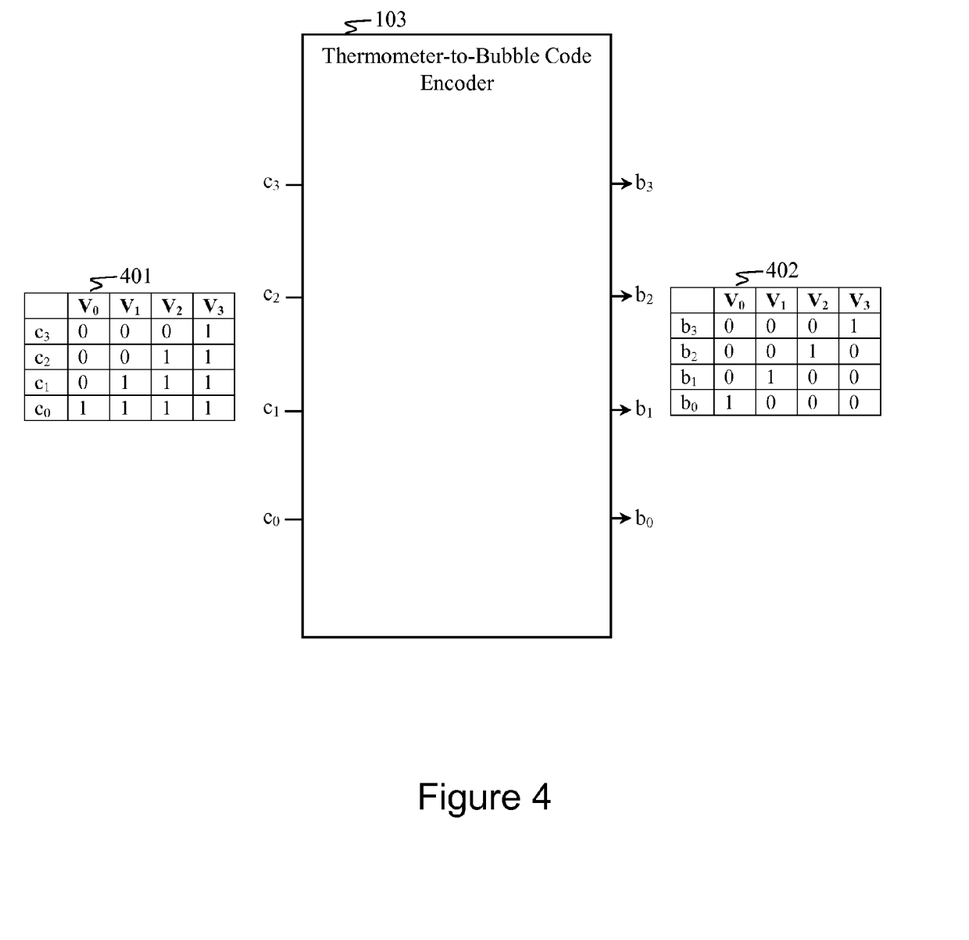
FIG. 4 depicts a conversion function of a thermometer-to-bubble code encoder configured in accordance with certain aspects of the present disclosure.

FIG. 4 depicts the conversion function of the thermometer-to-bubble code encoder 103. The thermometer code $c=[c_0\ c_1\ c_2\ c_3]$ for each voltage range $V_0$-$V_3$ is depicted in table 401. For each thermometer code input c, the encoder 103 produces a bubble code output $b=[b_0\ b_1\ b_2\ b_3]$, which is depicted in table 402.

Figure 5:
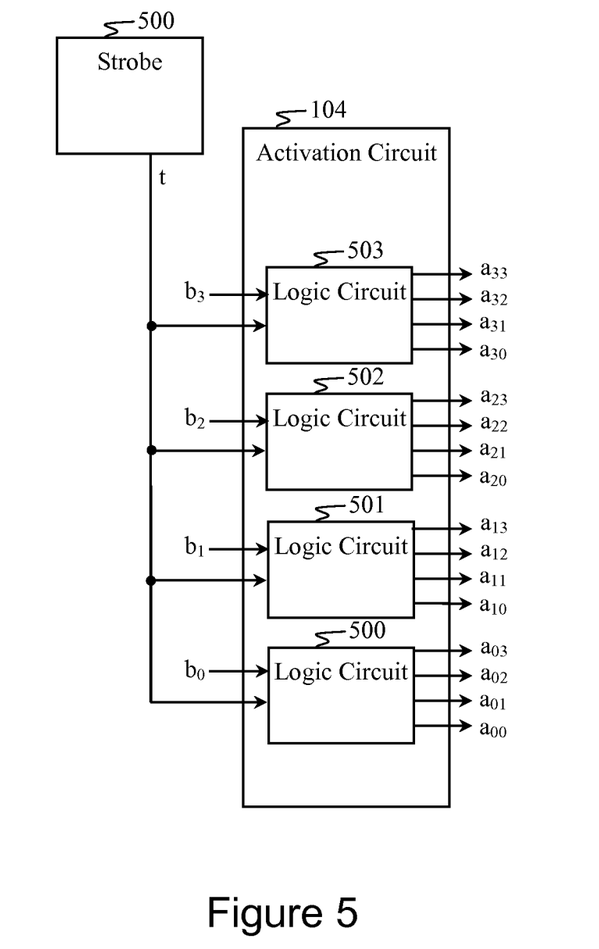
FIG. 5 is a block diagram of an activation circuit configured in accordance with one aspect of the present disclosure.

FIG. 5 is a block diagram of the activation circuit 104, which is configured in accordance with one aspect of the invention. The activation circuit 104 processes the bubble code $b=[b_0\ b_1\ b_2\ b_3]$ and a clock signal t, such as a strobe signal generated by a strobe circuit 500, to produce a set of activation signals. The clock signal t is a time-varying signal, such as a binary signal that transitions from a first state to a second state at regular known intervals. Typically, the clock signal t transitions between the first state and the second state at least once during the sample interval. In some aspects of the invention, the strobe circuit 500 may be part of the activation circuit. The activation circuit 104 comprises a plurality of logic circuits 500-503, and each logic circuit 500-503 is configured for processing a bubble code bit $b_n$ and the clock signal t to produce a set of activation signals. For example, an $n^{th}$ logic circuit processes an $n^{th}$ bit $b_n$ of the bubble code b and produces a plurality of activation signals $a_n = [a_{n0}\ a_{n1}\ a_{n2}\ a_{n3}]$. The activation signals may be clock signals, such as clock signal t, or a constant signal that has no state transitions during the sample interval.

Figure 6:
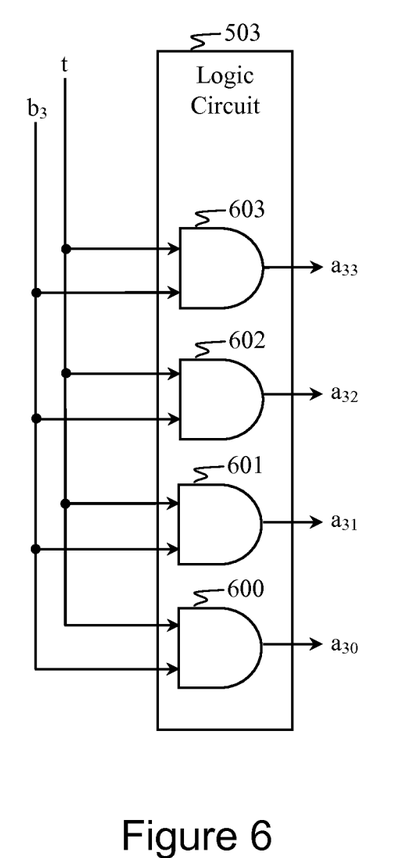
FIG. 6 is a block diagram of one of a plurality of logic circuits in an activation circuit configured in accordance with certain aspects of the present disclosure.

FIG. 6 is a block diagram of one of the logic circuits 503 in the activation circuit 104 configured in accordance with an aspect of the invention. The logic circuit 503 comprises a plurality of AND gates 600-603. Each AND gate 600-603 performs a logical AND operation on the clock signal t and the bubble code bit $b_3$ to produce a set of activation signals $[a_{30}\ a_{31}\ a_{32}\ a_{33}]$. In an alternative aspect, the logic circuit 503 may replicate the output of a single logical AND operation on the clock signal t and the bubble code bit $b_3$ to produce the set of activation signals $[a_{30}\ a_{31}\ a_{32}\ a_{33}]$. In this case, the number of activation signals produced by logic circuit 503 is equal to a predetermined number of dynamic comparators to be activated in the fine-measurement circuit 105.

Figure 7:
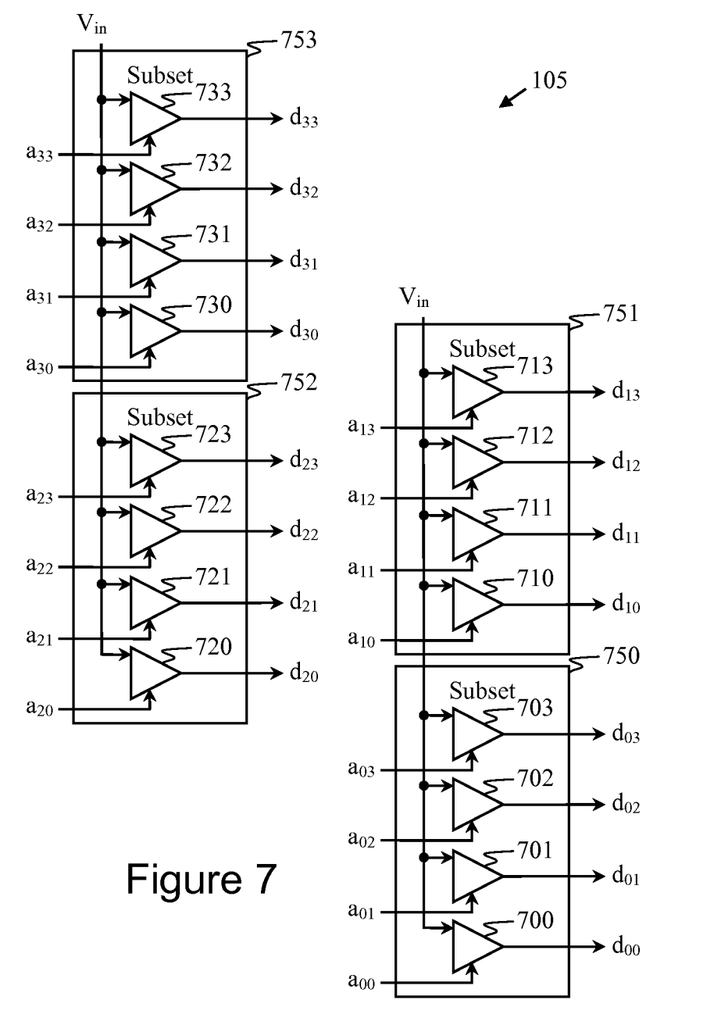
FIG. 7 is a block diagram of a fine-measurement circuit configured in accordance with one aspect of the present disclosure.

FIG. 7 is a block diagram of the fine-measurement circuit 105 according to one aspect of the invention. Each of a plurality of comparator subsets 750, 751, 752, and 753 is responsive to a corresponding set of activation signals. For example, the activation signals $[a_{00}\ a_{01}\ a_{02}\ a_{03}]$ produced by logic circuit 500 are coupled to subset 750, the activation signals $[a_{10}\ a_{11}\ a_{12}\ a_{13}]$ produced by logic circuit 510 are coupled to subset 751, the activation signals $[a_{20}\ a_{21}\ a_{22}\ a_{23}]$ produced by logic circuit 520 are coupled to subset 752, and the activation signals $[a_{30}\ a_{31}\ a_{32}\ a_{33}]$ produced by logic circuit 530 are coupled to subset 753.

Each of the subset 750-753 comprises a plurality of dynamic comparators. In one aspect of the invention, the comparators in each subset 750-753 may each comprise a preamplifier. The number of dynamic comparators in each subset 750-753 may equal the number of activation signals produced by the subset's 750, 751, 752, and 753 corresponding logic circuit 500, 510, 520, and 530, respectively. For example, subset 750 comprises dynamic comparators 700-703, subset 751 comprises dynamic comparators 710-713, subset 752 comprises dynamic comparators 720-723, and subset 753 comprises dynamic comparators 730-733.

Dynamic devices are logic circuits that generate an output depending upon a predetermined combination of inputs. Dynamic devices may be characterized by two states, precharge and evaluate. In the precharge state, a storage node is charged to a predetermined voltage level. In the evaluate state, depending on the combination of inputs, an array of pulldown transistors configured in a basic logical function (e.g., NAND, NOR, or combinations thereof) either discharges the node to a second predetermined voltage level or allows the charge to persist. The final voltage at the node, high or low, serves as the device's output, which may additionally be buffered and, perhaps, inverted. A dynamic comparator is one type of dynamic device.

A clock signal (such as an activation signal $a_{nm}$ that transitions between two states during the sample interval) may activate each dynamic comparator in at least one of the subsets 750-753. As shown in FIG. 5, the activation circuit 104 comprises at least one clock signal t input and a plurality of logic value inputs $b_0$, $b_1$, $b_2$, and $b_3$ coupled from the thermometer-to-bubble code encoder 103. The activation circuit 104 comprises logic circuits 500-503 configured for generating activation signal outputs depending on the logic circuit inputs (i.e., the clock signal t and the logic values $b_n$). Thus, the activation signal $a_{nm}$ supplied to each dynamic comparator 700-703, 710-713, 720-723, and 730-733 depends on the output from the coarse-measurement circuit 102.

In the aspect of the invention depicted by FIG. 6, the clock signal t and the encoder 103 output $b_3$ are logically ANDed by the array of AND gates 600-603 in the logic circuit 503. If the bit $b_3$ is a logic-high value (which corresponds to $V_{in}$ being within the reference-voltage range $V_3$), the activation signal outputs $[a_{30}\ a_{31}\ a_{32}\ a_{33}]$ are characterized by the clock signal t. If the bit $b_3$ is a logic-low value, the output is a constant low-value (i.e., $[a_{30}\ a_{31}\ a_{32}\ a_{33}]$ are characterized by a constant low state).

During each sample time interval, one of the logic circuits 500-503 receives a logic-high bit $b_n$ and generates clock-signal outputs, which activate its corresponding subset 750-753 of dynamic comparators. The other subsets 750-753 receive constant low-state signals, which do not activate their dynamic comparators. Thus, the activation signals control which subset 750, 751, 752, or 753 performs a fine measurement of the analog input signal $V_{in}$. For example, a clock signal t generated by logic circuit 503 as the activation signal outputs $[a_{30}\ a_{31}\ a_{32}\ a_{33}]$ activates each dynamic comparator 730-733 in subset 753 into its precharge state. In some aspects of the invention, a low-state to high-state transition of the activation signal activates the dynamic comparator 730-733. In some aspects of the invention, a high-state to low-state transition of the activation signal activates the dynamic comparators 730-733. During the precharge state, the activation signal initiates charging of a storage node (not shown) in each dynamic comparator 730-733.

When the logic circuit 503 generates clock signal outputs t, the other logic circuits 500-502 produce constant low-state outputs (i.e., non-strobe signals). Thus, only the dynamic comparators 730-733 in subset 753 are activated. The comparators in the other subsets 750-752 are prevented from initiating their precharge states, thereby conserving power. In most cases, fewer comparators 700-703, 710-713, 720-723, and 730-733 in the fine-measurement circuit 105 need to be activated, which reduces the number of voltage comparators that have to assert a high logic value at their output. Thus, aspects of the invention may substantially reduce the average dissipated power of the ADC.

Figure 8:
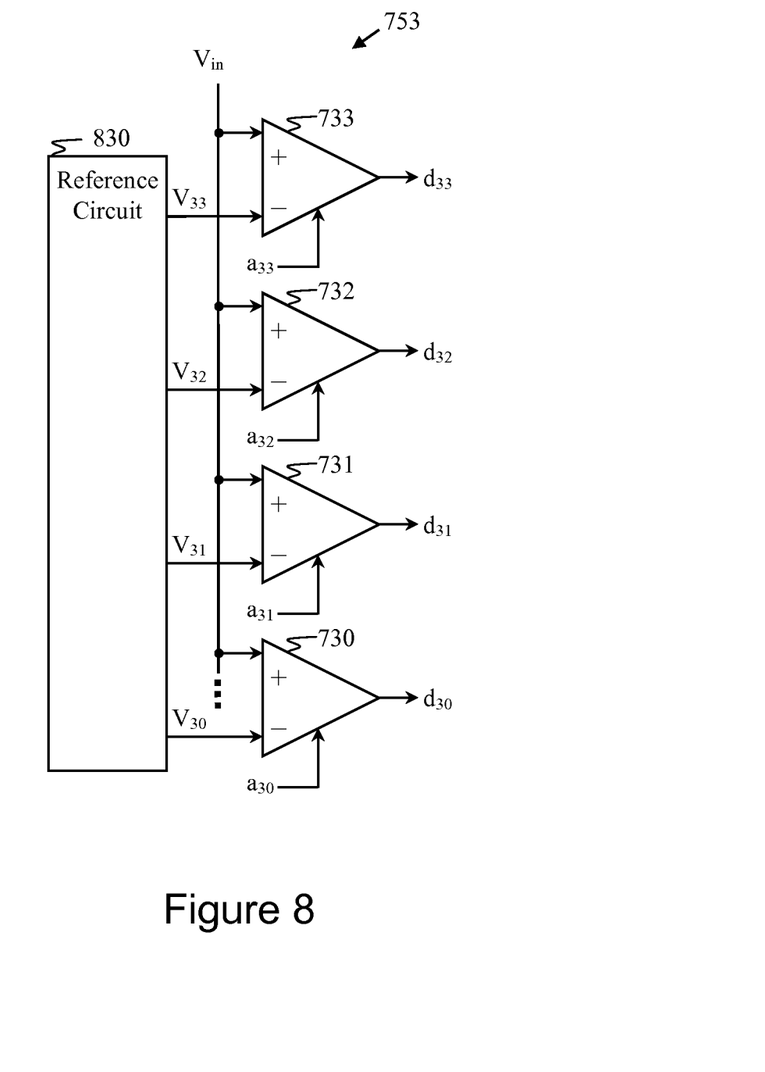
FIG. 8 is a block diagram of a subset of dynamic comparators configured in accordance with one aspect of the present disclosure.

With respect to the subset 753 depicted in FIG. 8, during the evaluate state, each dynamic comparator 730-733 processes the input voltage $V_{in}$ and a reference voltage $V_{30}$-$V_{33}$ generated by a reference circuit 830. Each comparator 730-733 has a different fine-measurement threshold voltage applied to a first input, wherein these threshold voltages are typically spread uniformly across a predetermined voltage range. For example, the comparators 730-733 may be configured for performing a fine measurement across the voltage range $\Delta V_3$ described with respect to FIG. 3, wherein the reference voltages $V_{30}$-$V_{33}$ are selected to provide the subset 753 with a fine-measurement resolution of $\Delta V/4$. In other aspects of the invention, the fine measurement may be performed across a voltage range that is greater than the corresponding coarse-measurement resolution $\Delta V$.

In FIG. 8, reference voltage $V_{3m}$ is input to an $m^{th}$ dynamic comparator 730-733. Each comparator 730-733 may comprise an NAND stack that discharges the storage node (not shown) if $V_{in} < V_{3m}$ for generating a low-state output $d_{3m}$. Otherwise, if $V_{in} \geq V_{3m}$, the dynamic comparator 730-733 produces a high-state output $d_{3m}$. The thermometer code $[d_{30}\ d_{31}\ d_{32}\ d_{33}]$ and the thermometer code c is then logically decoded to a binary-coded digital representation of the input voltage $V_{in}$, by the encoder 106, which is depicted in the block diagram of FIG. 9.

Figure 9:
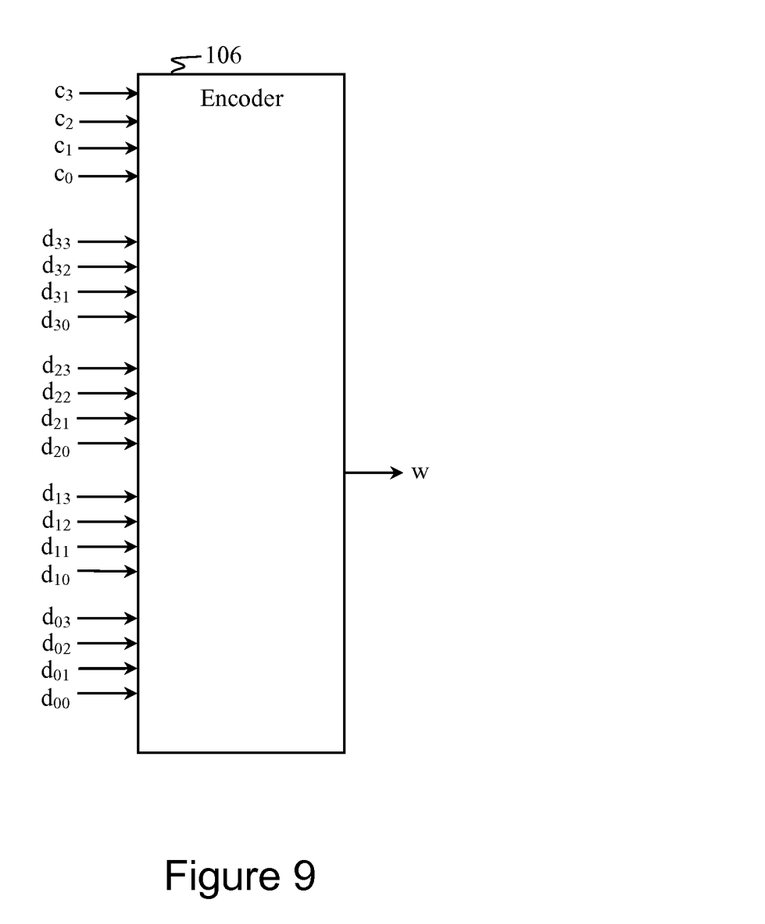
FIG. 9 is a block diagram of an encoder configured in accordance with one aspect of the present disclosure.

The encoder 106 processes the coarse measurements (e.g., the thermometer code c output by the coarse-measurement circuit 102) and the fine measurements $d_{nm}$ from the fine-measurement circuit 105 for generating a binary word characterizing the voltage of the input analog signal $V_{in}$.

Figure 10:
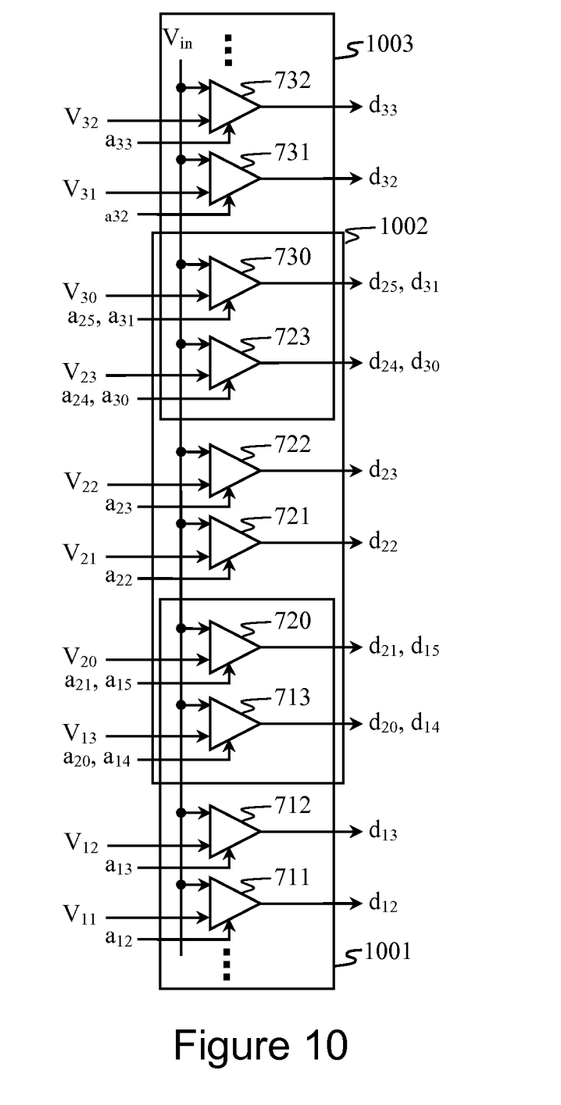
FIG. 10 is a block diagram depicting a plurality of overlapping subsets of comparators in accordance with one aspect of the disclosure.

FIG. 10 is a block diagram depicting a plurality of subsets 1001, 1002, and 1003 of comparators in accordance with one aspect of the invention. Subset 1002 comprises dynamic comparators 713, 720-723, and 730. Comparators 713 and 720 are also in subset 1001, and comparators 723 and 730 are also in subset 1003. Therefore, in this aspect of the invention, the voltage range over which fine measurements are performed is larger than the coarse-measurement resolution (i.e., the quantization step size of the coarse measurement). Furthermore, the sharing of comparators between different subsets indicates that adjacent fine-measurement voltage ranges overlap. For example, the voltage range of $V_{in}$ measured by the coarse-measurement circuit 102 may be from $V_{20}$ to $V_{30}$. This voltage range is represented by comparators 720-723. However, the voltage range for the fine measurement may be extended beyond $V_{20}$ and $V_{30}$ by activating additional comparators, such as comparators 713 and 730. Thus, in response to a bubble code bit value $b_2=1$, an adaptation to the logic circuit 502 in the activation circuit 104 generates activation signals $a_{20}$-$a_{25}$, wherein activation signal $a_{20}$ is input to comparator 713, and activation signal $a_{25}$ is input to comparator 730.

Comparator 713 also receives activation signal $a_{14}$ produced by a modified version of the logic circuit 501. Similarly, comparator 730 also receives activation signal $a_{25}$ produced by a modified version of the logic circuit 503. Although not shown, multiple activation signals at a comparator (such as comparators 713 and 730) may be ANDed together by a logical AND gate at the comparator's input.

The output of comparator 713 may be $d_{14}$ if the comparator 713 was activated by an activation signal $a_{14}$, or $d_{20}$ if it was activated by activation signal $a_{20}$. In one aspect of the invention, the comparator 713 output may be coupled to multiple inputs at the encoder 106. In another aspect of the invention, each comparator's output is coupled to a single input at the encoder 106.

Figure 11:
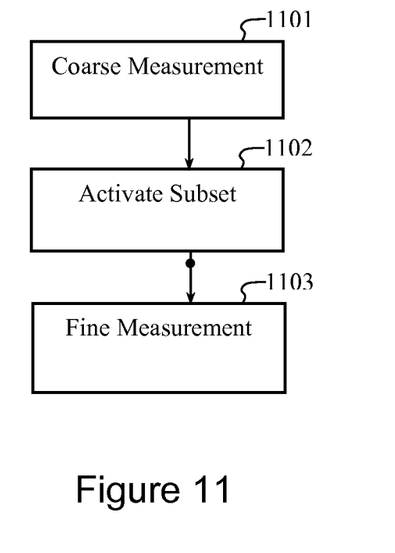
FIG. 11 is a flow diagram of a method for performing an analog to digital conversion in accordance with one aspect of the disclosure.

FIG. 11 is a flow diagram of a method according to an aspect of the invention. A coarse measurement 1101 of an analog input signal is performed for each sample interval, such as by a bank of coarse-measurement comparators, and a coarse-measurement thermometer code is generated therefrom. The coarse measurement is processed with a clock signal for generating 1102 a set of activation signals, comprising a set of clock signals and at least one set of constant-value signals. For example, the coarse measurement thermometer code may be converted to a coarse measurement bubble code, which is processed with a clock signal in a logic circuit to produce the activation signals. A fine measurement 1103 of the analog input signal is performed by a subset of dynamic comparators activated by the activation signals, wherein each dynamic comparator is configured for being activated by a clock signal.

In step 1101, the bank of comparators simultaneously compare samples of the input signal $V_{in}$. Each comparator may be provided with its own predetermined reference, or threshold voltage. These threshold voltages are typically spread uniformly across a voltage range from a lower reference voltage to a higher reference voltage. This provides a contiguous set of voltage ranges, each voltage range being the quantization step size, or coarse measurement resolution, of the bank of comparators. In some aspects of the invention, the voltage ranges comprise contiguous, non-overlapping voltage ranges. In other aspects, the voltage ranges may overlap.

The activation signals are generated 1102 to select which subset of dynamic comparators performs the fine measurement 1103. Each subset has a voltage range (i.e., a lower reference voltage to a higher reference voltage) corresponding to one of the voltage ranges of the coarse measurement 1101. Finally, the coarse measurements and the fine measurements may be processed together in an encoder, which generates the digital output word.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in Figures, those operations may have corresponding counterpart means-plus-function components with similar numbering.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CDROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware or any combination thereof.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An analog-to-digital converter (ADC) comprising:
a coarse-measurement circuit comprising a plurality of comparators configured for generating a coarse digital measurement of an analog input signal;
a fine-measurement circuit comprising a plurality of subsets of dynamic comparators, wherein each dynamic comparator is configurable for being activated by a clock signal, and each subset is configured for performing a fine digital measurement of the analog input signal;
an activation circuit configured for processing the coarse measurement and an input clock signal for generating a set of activation signals for activating one of the plurality of subsets to generate the fine digital measurement; and
a thermometer-to-bubble code encoder configured for converting a thermometer code output from the coarse-measurement circuit to a bubble code for input to the activation circuit.

2. The ADC recited in claim 1, further comprising a sample-and-hold circuit configured for providing the analog input signal.

3. The ADC recited in claim 1, further comprising an encoder configured for generating a binary coded digital output from the coarse digital measurement and the fine digital measurement.

4. The ADC recited in claim 1, wherein each of the coarse-measurement circuit and the fine-measurement circuit comprises a reference circuit.

5. The ADC recited in claim 1, wherein the activation circuit comprises a strobe configured for generating the input clock signal.

6. The ADC recited in claim 1, wherein the activation circuit comprises a plurality of logic circuits, each of the logic circuits configured for processing the input clock signal and a bubble code input for producing a plurality of activation signal outputs.

7. The ADC recited in claim 6, wherein each of the logic circuits comprises an array of AND logic gates.

8. The ADC recited in claim 1, wherein coarse measurement circuit has coarse-measurement resolution, and each of the plurality of subsets is configured for performing the fine measurement over a voltage range that is greater than or equal to the coarse measurement resolution.

9. The ADC recited in claim 1, wherein the fine measurement circuit is configured for performing the fine measurement across overlapping voltage ranges.

10. The ADC recited in claim 1, wherein at least one of the dynamic comparators is included in a plurality of the subsets.

11. A method of analog-to-digital conversion, comprising:
providing a coarse measurement of an analog input signal;
converting the coarse measurement from a thermometer code to a bubble code;
generating a set of activation signals from the bubble code and an input clock signal, the activation signals comprising a set of clock signals and at least one set of constant-value signals; and
activating a subset of a plurality of dynamic comparators for performing a fine measurement of the analog input signal.

12. The method recited in claim 11, wherein each of the plurality of dynamic comparators is configured for being activated by a clock signal.

13. The method recited in claim 11, wherein providing the coarse measurement is characterized by a coarse-measurement resolution, and performing the fine measurement employs a voltage range equal to or greater than the coarse-measurement resolution.

14. The method recited in claim 11, wherein the fine measurement employs overlapping voltage ranges.

15. The method recited in claim 11, further comprising generating a binary coded digital output from the coarse digital measurement and the fine digital measurement.

16. The method recited in claim 11, wherein each of the constant-value signals prevents its associated dynamic comparator from being activated into its precharge state.

17. An analog-to-digital conversion system, comprising:
means for providing a coarse measurement of an analog input signal;
means for converting the coarse measurement from a thermometer code to a bubble code;
means for generating a set of activation signals from the bubble code and an input clock signal, the activation signals comprising a set of clock signals and at least one set of constant-value signals; and
means for activating a subset of a plurality of dynamic comparators for performing a fine measurement of the analog input signal.

18. A method of analog-to-digital conversion, comprising:
providing a coarse measurement of an analog input signal;
converting the coarse measurement from a thermometer code to a bubble code;
generating a set of activation signals from the bubble code and an input clock signal, the activation signals comprising a set of clock signals and at least one set of constant-value signals, wherein each of the constant-value signals prevents its associated one of a plurality of dynamic comparators from being activated into its precharge state; and
activating a subset of the plurality of dynamic comparators for performing a fine measurement of the analog input signal.

* * * * *